United States Patent
Kawaguchi et al.

(10) Patent No.: US 8,541,796 B2
(45) Date of Patent: Sep. 24, 2013

(54) NITRIDE SEMICONDUCTOR LIGHT EMITTING DEVICE AND METHOD OF FABRICATING NITRIDE SEMICONDUCTOR LASER DEVICE

(75) Inventors: Yoshinobu Kawaguchi, Mihara (JP); Takeshi Kamikawa, Mihara (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 11/638,581

(22) Filed: Dec. 14, 2006

(65) Prior Publication Data

US 2007/0138491 A1 Jun. 21, 2007

(30) Foreign Application Priority Data

Dec. 16, 2005 (JP) ................................. 2005-363589

(51) Int. Cl.
*H01L 33/00* (2010.01)
(52) U.S. Cl.
USPC ................... 257/98; 257/13; 257/79; 257/94; 257/E33.025; 257/E33.028; 257/E33.03; 257/E33.033; 257/E33.034; 257/E33.06; 257/E33.067; 257/E33.068; 257/E33.069
(58) Field of Classification Search
USPC ..................... 257/E33.025, E33.034, E33.03, 257/13, 79, 94, 98, E33.028, E33.033, E33.06, 257/E33.067, E33.068, E33.069
See application file for complete search history.

(56) References Cited

U.S. PATENT DOCUMENTS

| | | | |
|---|---|---|---|
| 5,196,958 A | 3/1993 | Verbeek et al. | |
| 5,231,062 A | 7/1993 | Mathers et al. | |
| 5,741,724 A | 4/1998 | Ramdani et al. | |
| 5,777,792 A | 7/1998 | Okada et al. | |
| 6,249,534 B1 | 6/2001 | Itoh et al. | |
| 6,370,177 B1 | 4/2002 | Genei et al. | |
| 6,667,187 B2 | 12/2003 | Genei et al. | |
| 6,744,076 B2 | 6/2004 | Fukuyama et al. | |
| 6,812,152 B2 | 11/2004 | Lindström et al. | |

(Continued)

FOREIGN PATENT DOCUMENTS

| | | |
|---|---|---|
| JP | 03-049281 | 3/1991 |
| JP | 03-142892 | 6/1991 |

(Continued)

OTHER PUBLICATIONS

Office Action for related U.S. Appl. No. 11/638,582 dated Jun. 12, 2008.

(Continued)

*Primary Examiner* — Jay C Kim
(74) *Attorney, Agent, or Firm* — Harness, Dickey & Pierce, P.L.C.

(57) ABSTRACT

There is provided a nitride semiconductor light emitting device having a light emitting portion coated with a coating film, the light emitting portion being formed of a nitride semiconductor, the coating film in contact with the light emitting portion being formed of an oxynitride film deposited adjacent to the light emitting portion and an oxide film deposited on the oxynitride film. There is also provided a method of fabricating a nitride semiconductor laser device having a cavity with a facet coated with a coating film, including the steps of: providing cleavage to form the facet of the cavity; and coating the facet of the cavity with a coating film formed of an oxynitride film deposited adjacent to the facet of the cavity and an oxide film deposited on the oxynitride film.

8 Claims, 5 Drawing Sheets

(56) References Cited

U.S. PATENT DOCUMENTS

| | | | |
|---|---|---|---|
| 6,961,359 B2 | 11/2005 | Tojo et al. | |
| 7,564,884 B1 | 7/2009 | Ito et al. | |
| 2002/0006726 A1 | 1/2002 | Yamasaki et al. | |
| 2002/0024981 A1* | 2/2002 | Tojo et al. | 372/45 |
| 2002/0075928 A1 | 6/2002 | Genei et al. | |
| 2003/0015713 A1 | 1/2003 | Yoo | |
| 2003/0015715 A1 | 1/2003 | Sakai | |
| 2003/0048823 A1 | 3/2003 | Yamanaka | |
| 2003/0156614 A1 | 8/2003 | Ueda et al. | |
| 2003/0210722 A1 | 11/2003 | Arakida et al. | |
| 2004/0026710 A1 | 2/2004 | Tsuda et al. | |
| 2004/0165635 A1 | 8/2004 | Sugimoto et al. | |
| 2004/0190576 A1 | 9/2004 | Matsuoka et al. | |
| 2004/0213314 A1 | 10/2004 | Kunitsugu et al. | |
| 2004/0238810 A1 | 12/2004 | Dwilinski et al. | |
| 2004/0245535 A1 | 12/2004 | D'Evelyn et al. | |
| 2005/0032344 A1* | 2/2005 | Hatano et al. | 438/602 |
| 2005/0059181 A1 | 3/2005 | Yamane et al. | |
| 2005/0104162 A1 | 5/2005 | Xu et al. | |
| 2005/0127383 A1* | 6/2005 | Kikawa et al. | 257/98 |
| 2005/0281304 A1* | 12/2005 | Mochida | 372/46.01 |
| 2006/0093005 A1 | 5/2006 | Okunuki et al. | |
| 2006/0133442 A1 | 6/2006 | Kondou et al. | |
| 2006/0280668 A1 | 12/2006 | Dmitriev et al. | |
| 2007/0014323 A1 | 1/2007 | Tachibana et al. | |
| 2007/0138492 A1* | 6/2007 | Kamikawa et al. | 257/94 |
| 2007/0200493 A1 | 8/2007 | Hsu et al. | |
| 2007/0205410 A1 | 9/2007 | Ikeda et al. | |
| 2007/0205424 A1* | 9/2007 | Kamikawa et al. | 257/94 |
| 2007/0210324 A1* | 9/2007 | Kawaguchi et al. | 257/96 |
| 2007/0246720 A1* | 10/2007 | Kamikawa et al. | 257/94 |
| 2007/0290378 A1 | 12/2007 | Coffin et al. | |

FOREIGN PATENT DOCUMENTS

| | | |
|---|---|---|
| JP | 03-209895 | 9/1991 |
| JP | 09-162496 | 6/1997 |
| JP | 09-194204 | 7/1997 |
| JP | 09-283843 | 10/1997 |
| JP | 2743106 | 2/1998 |
| JP | 10-075014 | 3/1998 |
| JP | 2000-021860 | 1/2000 |
| JP | 2002-100830 | 4/2002 |
| JP | 2002-237648 | 8/2002 |
| JP | 2002-335053 | 11/2002 |
| JP | 2005-175111 A | 6/2005 |
| JP | 2005-340625 | 12/2005 |
| KR | 10-2005-0069340 | 7/2005 |

OTHER PUBLICATIONS

Office Action for U.S. Appl. No. 11/785,981 dated Jun. 26, 2008.
Office Action for related U.S. Appl. No. 11/713,761 dated Sep. 4, 2008.
Notice of Allowance for corresponding Korean patent application No. 10-2006-126058 dated May 15, 2008 and English translation thereof.
Office Action for related U.S. Appl. No. 11/638,582 dated Oct. 20, 2008.
Advisory Action for related U.S. Appl. No. 11/713,761 dated Dec. 30, 2008.
Office Action for related U.S. Appl. No. 11/785,981 dated Dec. 30, 2008.
Office Action for copending U.S. Appl. No. 11/713,761 dated Apr. 6, 2009.
Office Action dated Jun. 4, 2009 from copending U.S. Appl. No. 11/785,981.
Office Action dated Aug. 3, 2009 from copending U.S. Appl. No. 11/638,582.
Office Action dated Oct. 15, 2009 from copending U.S. Appl. No. 12/314,402.
Office Action dated Sep. 25, 2009 from copending U.S. Appl. No. 11/713,760.
Office Action dated Sep. 22, 2009 from copending U.S. Appl. No. 11/713,761.
Office Action dated Dec. 14, 2009 from copending U.S. Appl. No. 11/785,981.
Advisory Action dated Jan. 12, 2010 from copending U.S. Appl. No. 11/713,761.
Advisory Action dated Apr. 21, 2010 from copending U.S. Appl. No. 11/638,582.
Office Action dated Jan. 25, 2010 from copending U.S. Appl. No. 12/153,756.
Office Action dated Jan. 26, 2010 from copending U.S. Appl. No. 11/638,582.
Office Action dated Mar. 16, 2010 from copending U.S. Appl. No. 11/713,761.
Advisory Action dated Mar. 23, 2010 from copending U.S. Appl. No. 11/785,981.
Office Action dated Jun. 17, 2010 from copending U.S. Appl. No. 12/153,756.
Office Action dated May 26, 2010 from copending U.S. Appl. No. 12/382,530.
Office Action dated May 26, 2010 from copending U.S. Appl. No. 12/314,402.
Office Action dated Jun. 9, 2010 from copending U.S. Appl. No. 12/153,314.
Hartnett, et al., "*Optical properties of ALON (aluminum oxynitride)*", Infrared Physics & Technology, vol. 39, pp. 203-211 (1998).
Dreer, et al., "*Statistical evaluation of refractive index, growth rate, hardness and Young's modulus of aluminium oxynitride films*", Thin Solid Films, vol. 354, pp. 43-49 (1999).
Office Action mailed Oct. 7, 2010 from co-pending U.S. Appl. No. 12/805,644.
Office Action mailed Oct. 7, 2010 from co-pending U.S. Appl. No. 12/382,530.
Office Action mailed Oct. 13, 2010 from co-pending U.S. Appl. No. 12/153,756.
Office Action mailed Oct. 28, 2010 from co-pending U.S. Appl. No. 11/713,761.
Office Action mailed Nov. 24, 2010 from co-pending U.S. Appl. No. 12/153,314.
Office Action mailed Nov. 24, 2010 from co-pending U.S. Appl. No. 12/213,686.
Office Action mailed Dec. 6, 2010 from co-pending U.S. Appl. No. 12/314,402.
Advisory Action mailed Feb. 18, 2011 from co-pending U.S. Appl. No. 12/153,314.
Office Action mailed Mar. 18, 2011 from co-pending U.S. Appl. No. 12/153,756.
Office Action mailed Mar. 21, 2011 from co-pending U.S. Appl. No. 12/213,686.
US Office Action mailed Jun. 8, 2011 issued in co-pending U.S. Appl. No. 12/232,525.
US Office Action mailed Jun. 23, 2011 issued in co-pending U.S. Appl. No. 12/314,402.
US Office Action mailed Aug. 23, 2011 issued in co-pending U.S. Appl. No. 12/153,314.
US Office Action mailed Sep. 2, 2011 issued in co-pending U.S. Appl. No. 11/785,981.
US Office Action mailed Apr. 22, 2011 issued in co-pending U.S. Appl. No. 12/382,530.
US Office Action mailed May 2, 2011 issued in co-pending U.S. Appl. No. 12/805,644.
US Office Action mailed Jul. 20, 2011 issued in co-pending U.S. Appl. No. 12/153,756.
US Advisory Action mailed Oct. 4, 2011 issued in co-pending U.S. Appl. No. 12/314,402.
US Office Action mailed Nov. 9, 2011 issued in co-pending U.S. Appl. No. 12/314,402.
US Office Action mailed Oct. 12, 2011 issued in co-pending U.S. Appl. No. 12/805,644.
US Office Action mailed Nov. 15, 2011 issued in co-pending U.S. Appl. No. 12/153,756.
US Office Action mailed Oct. 7, 2011 issued in co-pending U.S. Appl. No. 12/232,525.

US Office Action mailed Oct. 7, 2011 issued in co-pending U.S. Appl. No. 11/638,582.
US Office Action mailed Oct. 7, 2011 issued in co-pending U.S. Appl. No. 12/382,530.
US Office Action mailed Jan. 3, 2012 issued in co-pending U.S. Appl. No. 11/785,981.
US Advisory Action mailed Jan. 26, 2012 issued in co-pending U.S. Appl. No. 12/232,525.
US Office Action mailed Feb. 15, 2012 issued in co-pending U.S. Appl. No. 12/153,314.
US Office Action mailed Mar. 29, 2012 issued in co-pending U.S. Appl. No. 11/638,582.
US Advisory Action mailed Jun. 4, 2012 issued in co-pending U.S. Appl. No. 12/805,644.
US Advisory Action mailed Jun. 1, 2012 issued in co-pending U.S. Appl. No. 12/153,314.
US Office Action mailed Apr. 27, 2012 issued in co-pending U.S. Appl. No. 13/200,357.
US Office Action mailed Feb. 16, 2012 issued in co-pending U.S. Appl. No. 12/805,644.
US Office Action mailed Feb. 28, 2012 issued in co-pending U.S. Appl. No. 12/314,402.

* cited by examiner

NITRIDE SEMICONDUCTOR LIGHT EMITTING DEVICE AND METHOD OF FABRICATING NITRIDE SEMICONDUCTOR LASER DEVICE

This nonprovisional application is based on Japanese Patent Application No. 2005-363589 filed with the Japan Patent Office on Dec. 16, 2005, the entire contents of which are hereby incorporated by reference.

BACKGROUND OF THE INVENTION

1. Field of the Invention

The present invention relates to nitride semiconductor light emitting devices and methods of fabricating nitride semiconductor laser devices.

2. Description of the Background Art

It is generally known that a semiconductor laser device having a cavity with a facet degraded is impaired in reliability. It is considered that a cavity has a facet degraded when a nonradiative recombination level exists and accordingly the facet excessively generates heat. A major cause of such level is that the cavity has a facet oxidized.

Accordingly Japanese Patent Laying-Open No. 09-162496 discloses a method coating a facet of a cavity with a coating film formed of a nitride excluding oxygen to prevent the cavity from having the facet oxidized. Furthermore, Japanese Patent Laying-Open No. 2002-237648 discloses a method coating a facet of a cavity of a nitride semiconductor laser device with a coating film of dielectric material of the same nitride as the facet to reduce a nonradiative recombination level.

Thus coating a facet of a cavity with a coating film of nitride has conventionally been known. Among nitrides, aluminum nitride (AlN) is particularly chemically and thermally stable and is an insulator of good quality, and is also high thermal conductivity and significantly effectively dissipates heat. As such, it exhibits an excellent feature as a coating film coating a facet of a cavity of a semiconductor laser (see Japanese Patent Laying-Open No. 03-209895 for example). A coating film which does not contain oxygen, however, is generally high in stress and considered to lead to degradation such as dark line for example.

SUMMARY OF THE INVENTION

The present inventors have studied to develop a technique to form AlN film on a facet of a cavity to implement a nitride semiconductor laser device that can be driven for high output without impairing reliability as the cavity has the facet degraded.

Initially, ECR sputtering is performed with aluminum (Al) and gaseous nitrogen to deposit a 6 nm thick AlN film at 100° C. on a light emitting facet of a cavity of a nitride semiconductor laser device. Then on the AlN film a 76 nm thick aluminum oxide film is deposited to provide a reflectance of 5%. Furthermore, the nitride semiconductor laser device is provided at a light reflecting facet of the cavity with a highly reflective film formed of a pair of silicon oxide film and titanium oxide film to obtain a high reflectance of at least 95%.

The nitride semiconductor laser device thus fabricated is placed in an environment of 70° C. and continuously lased to provide an optical output of 100 mW to conduct an aging test. As shown in FIG. 9, of 15 nitride semiconductor laser devices, 8 nitride semiconductor laser devices suddenly stop lasing. The nitride semiconductor laser devices having stopped lasing were examined and it has been found that their cavities have their light emitting facets degraded. The present inventors considered that the 6 nm thick AlN film deposited on the light emitting facet is still large in stress, and accordingly the AlN film is reduced in thickness to 2 nm. The result was, however, substantially the same. It has thus been found that providing a nitride semiconductor laser device having a light emitting facet of a cavity with AlN film, as conventional, is insufficient to obtain high reliability.

Furthermore, if a nitride semiconductor light emitting diode device has a light emitting plane as a light emitting portion, provided with AlN film, and the light emitting plane, formed of nitride semiconductor, and the AlN film contact each other less closely, then a nonradiative center or the like provided at their interface absorbs light. This results in poor efficiency in extracting light and hence impaired reliability.

Accordingly the present invention contemplates a nitride semiconductor light emitting device and method of fabricating a nitride semiconductor laser device that can enhance reliability.

The present invention is a nitride semiconductor light emitting device having a light emitting portion coated with a coating film, and the light emitting portion is formed of a nitride semiconductor and the coating film in contact with the light emitting portion is formed of an oxynitride film deposited adjacent to the light emitting portion and an oxide film deposited on the oxynitride film.

Herein the present nitride semiconductor light emitting device may be a nitride semiconductor laser device and the light emitting portion may be a facet of a cavity.

Furthermore in the present nitride semiconductor light emitting device the oxynitride film can be one of aluminum oxynitride film and silicon oxynitride film.

Furthermore in the present nitride semiconductor light emitting device the oxide film can be one of aluminum oxide film, silicon oxide film, titanium oxide film, hafnium oxide film, zirconium oxide film, niobium oxide film, tantalum oxide film, and yttrium oxide film.

Furthermore the present invention is a method of fabricating the nitride semiconductor laser device having a cavity with a facet coated with a coating film, including the steps of: providing cleavage to form the facet of the cavity; and coating the facet of the cavity with a coating film formed of an oxynitride film deposited adjacent to the facet of the cavity and an oxide film deposited on the oxynitride film.

Furthermore in the present method of fabricating the nitride semiconductor laser device the oxynitride film can be fabricated by using aluminum oxide as a target.

The present invention can thus provide a nitride semiconductor light emitting device and method of fabricating a nitride semiconductor laser device that can enhance reliability.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
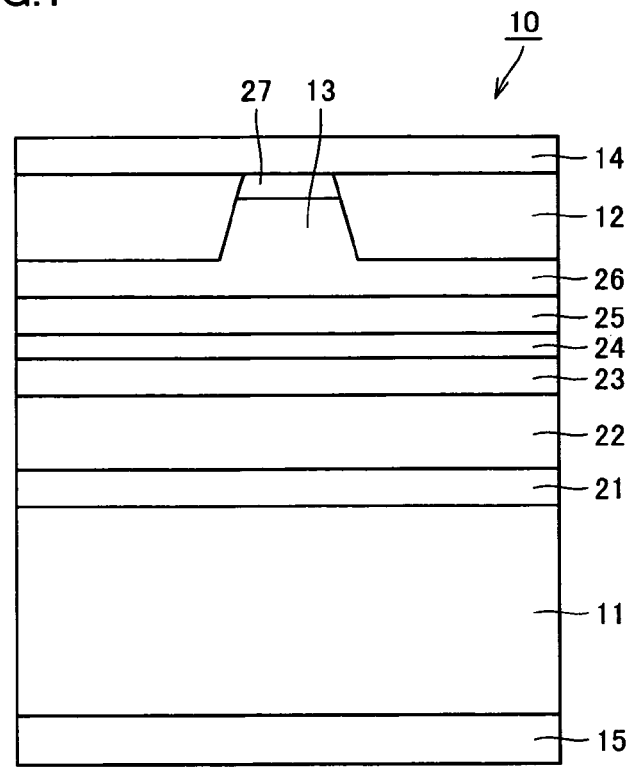
FIG. 1 is a schematic cross section of one preferred example of the present nitride semiconductor laser device in a first embodiment.

Hereinafter embodiments of the present invention will be described. Note that in the figures, identical reference characters denote identical or corresponding components.

The present invention is a nitride semiconductor light emitting device having a light emitting portion coated with a coating film. The light emitting portion is formed of nitride semiconductor and the coating film contacting the light emitting portion is formed of an oxynitride film deposited adjacent to the light emitting portion and an oxide film deposited on the oxynitride film. Thus in the present invention the light emitting portion can be coated with a coating film formed of an oxynitride film deposited adjacent to the light emitting portion and an oxide film deposited on the oxynitride film to enhance the nitride semiconductor light emitting device in reliability.

Herein the present nitride semiconductor light emitting device for example includes a nitride semiconductor laser device, a nitride semiconductor light emitting diode device, and the like. Furthermore, if the present nitride semiconductor light emitting device is a nitride semiconductor laser device, its light emitting portion corresponds to a facet of a cavity. If the present nitride semiconductor light emitting device is the nitride semiconductor light emitting diode device, then its light emitting portion corresponds to a light emitting plane. Note that in the present invention the nitride semiconductor laser device indicates a semiconductor laser device at least having an active layer and a clad layer formed of material containing AlInGaN (a compound of nitrogen and at least one type of element selected from the group consisting of aluminum, indium and gallium) as a main component (a component contained in an amount of at least 50 mass %). Furthermore in the present invention a facet of a cavity means a mirror plane formed at least by cleaving a stack including a semiconductor substrate and an active layer and a clad layer stacked on the substrate.

Furthermore, the oxynitride film employed in the prevent invention can be implemented for example by aluminum oxynitride film or silicon oxynitride film. Furthermore, the oxide film employed in the present invention can be implemented for example by aluminum oxide film, silicon oxide film, titanium oxide film, hafnium oxide film, zirconium oxide film, niobium oxide film, tantalum oxide film, or yttrium oxide film. Note that in the present invention the coating film formed of the oxynitride film and the oxide film may have another film deposited thereon.

Furthermore, if the present nitride semiconductor light emitting device is a nitride semiconductor laser device, then the present nitride semiconductor laser device can be fabricated by a method including the steps of: forming a facet of a cavity by cleavage; and coating the facet of the cavity with a coating film formed of an oxynitride film deposited adjacent to the facet of the cavity and an oxide film deposited on the oxynitride film.

Herein if the oxynitride film is aluminum oxynitride film then the aluminum oxynitride film can be formed for example by providing a target of aluminum oxide in a film deposition furnace, introducing only gaseous nitrogen into the film deposition furnace, and performing reactive sputtering. Thus employing the target of aluminum oxide can eliminate the necessity of intentionally introducing gaseous oxygen into the film deposition furnace in depositing the aluminum oxynitride film.

Furthermore, if the oxynitride film is aluminum oxynitride film, aluminum is prone to oxidation, and if gaseous oxygen is introduced into the film deposition furnace, there is a tendency that it is difficult to exert control to provide an oxynitride controlled in composition to have a small content of oxygen, and to reproduce such oxynitride. However, this can be addressed by using as a target of an aluminum oxide represented by $Al_xO_y$, and relatively less oxidized, and avoiding introducing gaseous oxygen into the film deposition furnace and instead introducing gaseous nitrogen alone thereinto so that an aluminum oxynitride film having a small content of oxygen can be relatively readily deposited, wherein $0<x<1$, $0<y<0.6$, and $x+y=1$. Furthermore, replacing the target of the aluminum oxide represented by $Al_xO_y$ and relatively less oxidized with a target of an aluminum oxynitride film having a small content of oxygen can be similarly effective wherein $0<x<1$, $0<y<0.6$, and $x+y=1$.

Furthermore, modifying a degree of vacuum in the film deposition furnace and/or modifying temperature and/or the like condition(s) therein for film deposition can also provide an oxynitride film varied in content of oxygen and hence composition.

Furthermore, if the film deposition furnace has an internal wall oxidized or is provided at the internal wall with aluminum oxide, and thereafter gaseous argon and gaseous nitrogen are introduced into the film deposition furnace, and a target of Al is employed and sputtering is thus performed to deposit a film, then the internal wall has oxygen departed by a plasma, and an aluminum oxynitride film can thus be formed.

First Embodiment

FIG. 1 is a schematic cross section of one preferred example of a nitride semiconductor laser device of the present embodiment. Herein the present embodiment provides a nitride semiconductor laser device 10 including an n type GaN substrate 11, an n type AlGaInN buffer layer 21 deposited thereon, an n type AlGaInN clad layer 22 deposited thereon, an n type AlGaInN guide layer 23 deposited thereon, an AlGaInN multi quantum well active layer 24 deposited thereon, a p type AlGaInN guide layer 25 deposited thereon, a p type AlGaInN clad layer 26 deposited thereon, and a p type AlGaInN contact layer 27 deposited thereon. It should be noted that each layer has a composition ratio adjusted as appropriate and thus irrelevant to the essence of the present invention. Furthermore in the present embodiment the nitride semiconductor laser device lases at a wavelength which can be adjusted, as appropriate, within a range for example of 370 nm to 470 nm depending on the composition ratio of AlGaInN multi quantum well active layer 24. The present embodiment is adjusted to allow lasing at a wavelength of 405 nm. Furthermore, AlGaInN multi quantum well active layer 24 may contain at least one type of element of As, P and similar group V elements in an amount approximately of at least 0.01 atomic % to 10 atomic %.

Furthermore in the present embodiment nitride semiconductor laser device 10 has p type AlGaInN clad layer 26 and p type AlGaInN contact layer 27 partially removed to have ridged stripe portion 13 extending in the direction of the length of a cavity. Herein ridged stripe portion 13 has a width for example of approximately 1.2 μm to 2.4 μm, typically approximately 1.5 μm. Furthermore, p type AlGaInN contact layer 27 has a surface provided with a p electrode 14 and under p electrode 14 an insulation film 12 is provided except for ridged stripe portion 13. Furthermore on n type GaN substrate 11 at a surface opposite that having the aforementioned layers stacked thereon an n electrode 15 is deposited.

Figure 2:
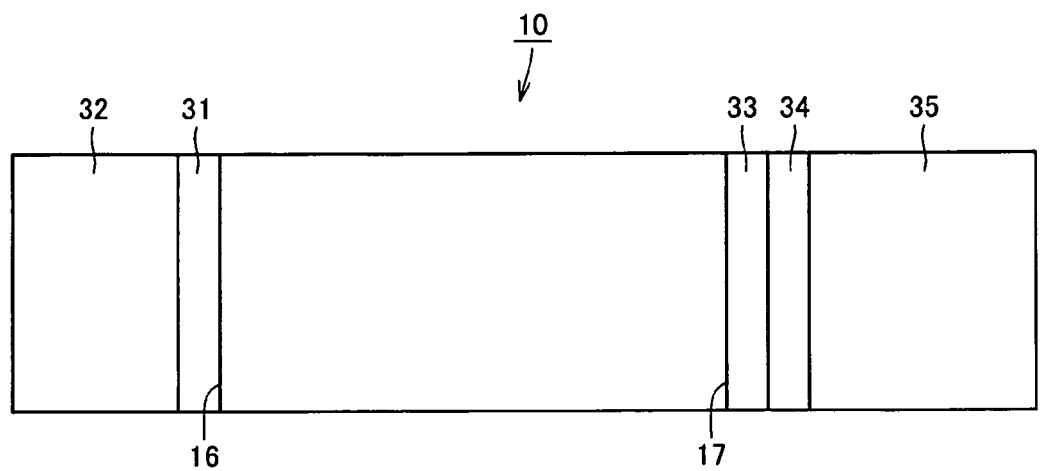
FIG. 2 is a schematic side view of the present nitride semiconductor laser device of the first embodiment shown in FIG. 1, as seen along the length of its cavity.

FIG. 2 is a schematic side view of the nitride semiconductor laser device of the present embodiment shown in FIG. 1, as seen in the direction of the length of the cavity. Herein in the present embodiment nitride semiconductor laser device 10 has the cavity with a light reflecting facet 17 and light emitting facet 16 serving as a light emitting portion, each formed by scribing and breaking with a diamond point and thus cleaving a wafer having deposited on the aforementioned n type GaN substrate the n type AlGaInN buffer layer and other aforementioned semiconductor layers in order in layers, and provided with a ridged stripe portion, followed by an insulation film and p and n electrodes. The cleavage provides a cleavage plane, which will serve as facets 16 and 17 parallel to each other as shown in FIG. 2.

On light emitting facet 16 a 6 nm thick aluminum oxynitride film 31 is deposited and thereon a 76 nm thick aluminum oxide film 32 is deposited to provide a reflectance of 5%. Furthermore on light reflecting facet 17 a 6 nm thick aluminum oxynitride film 33 is deposited and thereon a 80 nm thick aluminum oxide film 34 is deposited, and thereon a 71 nm thick silicon oxide film and a 46 nm thick titanium oxide film serving as one pair are deposited by four pairs in layers, with the silicon oxide film first deposited, and thereafter on a frontmost surface a 142 nm thick silicon oxide film is deposited to provide a highly reflective film 35.

While aluminum oxynitride film 31, aluminum oxide film 32, aluminum oxynitride film 33, aluminum oxide film 34 and highly reflective film 35 can each for example be sputtered through electron cyclotron resonance (ECR) as described hereinafter, the films can also be formed by a variety of other sputtering techniques, chemical vapor deposition (CVD) or the like.

Figure 3:
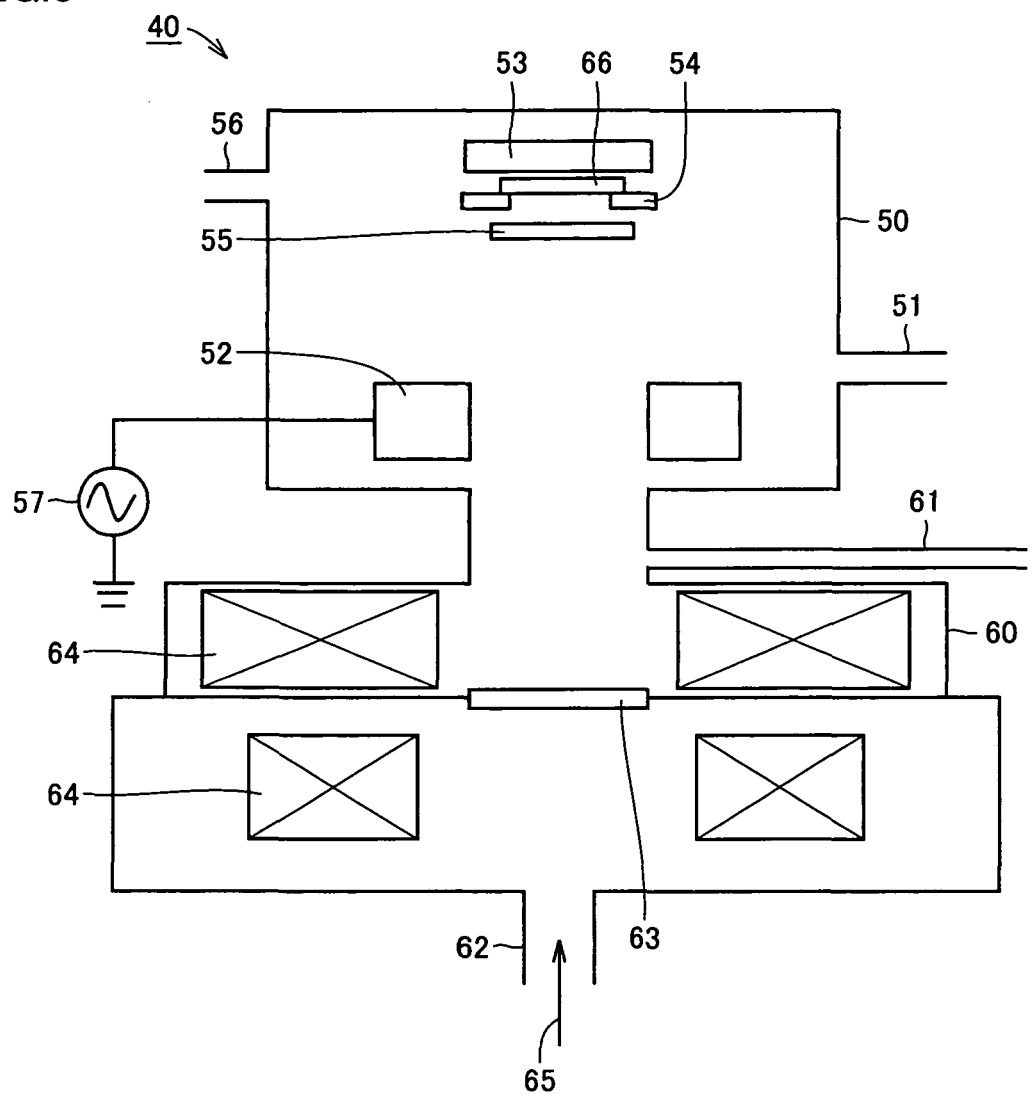
FIG. 3 schematically shows a configuration of an ECR sputtering apparatus.

FIG. 3 schematically shows an ECR sputtering apparatus in structure. Herein an ECR sputtering apparatus 40 is generally configured of a film deposition furnace 50 and a plasma generation chamber 60. Film deposition furnace 50 has a gas inlet 51 and a gas outlet 56 and is internally provided with a target 52, a heater 53, a sample stage 54 and a shutter 55. Furthermore on sample stage 54 a sample 66 cleaved as described above is placed and attached to a holder (not shown) in a direction allowing a film to be deposited on facet 16 or 17 of the cavity. Furthermore to gas outlet 56 a vacuum pump (not shown) is attached to allow gas internal to film deposition furnace 50 to be exhausted. Furthermore to target 52 an RF power supply 57 is connected.

Furthermore plasma generation chamber 60 has a gas inlet 61 and a microwave inlet 62 and is internally provided with a microwave introduction window 63 and a magnetic coil 64. Microwave inlet 62 introduces a microwave 65 which is in turned introduced through microwave introduction window 63 to generate a plasma from gas introduced through gas inlet 61.

ECR sputtering apparatus 40 thus configured is employed to first deposit the 6 nm thick aluminum oxynitride film 31 on the light emitting facet 16 of the cavity and subsequently deposit the 76 nm thick aluminum oxide film 32 on aluminum oxynitride film 31.

More specifically, initially, gaseous nitrogen is introduced into film deposition furnace 50 at a flow rate of 5.5 sccm and gaseous oxygen is introduced thereinto at a flow rate of 1.0 sccm, and furthermore, gaseous argon is introduced thereinto at a flow rate of 20.0 sccm to efficiently generate a plasma to deposit film faster. Then, in order to sputter the target 52 made of Al, an RF power of 500 W is applied to target 52 and a microwave power of 500 W required to generate plasma is applied. As a result, at a film deposition rate of 1.7 Å/sec, aluminum oxynitride film 31 having an index of refraction of 2.0 for light having a wavelength of 633 nm is deposited. Aluminum oxynitride film 31 is formed of aluminum, nitrogen and oxygen, and their respective contents (atomic %) can be measured for example by Auger electron spectroscopy (AES). Furthermore, the content of the oxygen forming the aluminum oxynitride film 31 can also be measured by transmission electron microscopy-energy dispersive x-ray spectroscopy (TEM-EDX).

Figure 4:
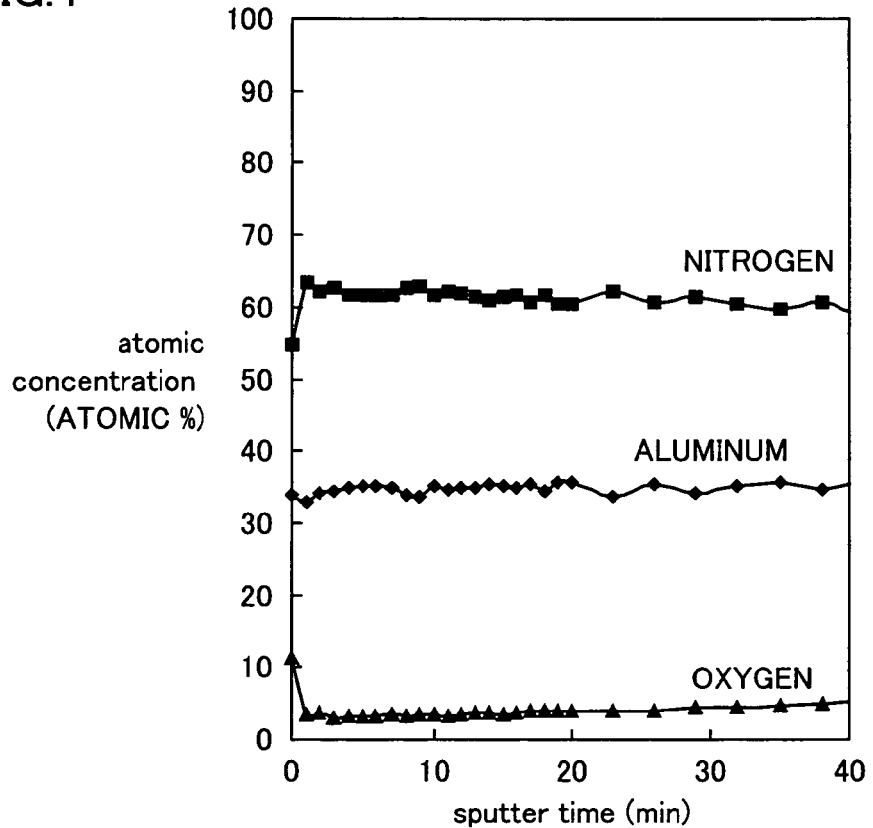
FIG. 4 represents a result of an analysis in composition, as seen depthwise, by AES of an aluminum oxynitride film separately prepared under a condition identical to that adopted in the first embodiment of the present invention.

FIG. 4 shows a result of a depthwise AES composition analysis of an aluminum oxynitride film separately provided under a condition identical to that described above. The contents of aluminum, oxygen and nitrogen, respectively, were obtained as based on an AES signal in intensity, with the sensitivity of a peak of each element considered. Herein, the aluminum, the oxide and the nitrogen together assume 100 atomic % and an element other than the aluminum, oxygen and nitrogen and contained in a small amount, such as argon, is excluded therefrom.

As shown in FIG. 4, the aluminum oxynitride film contains aluminum in an amount of 35 atomic %, oxygen in an amount of 3 atomic %, and nitrogen in an amount of 62 atomic % and has a substantially uniform composition as seen depthwise. It should be noted that, although not shown in FIG. 4, a negligible amount of argon was detected.

It should be noted that preferably before aluminum oxynitride film 31 is deposited, in the film deposition apparatus the cavity has facet 16 heated for example at at least 100° C. and at most 500° C. to remove oxide film, impurity and the like from facet 16 to clean it, although the present invention may dispense with doing so. Furthermore before aluminum oxynitride film 31 is deposited the cavity may have facet 16 exposed, for example to a plasma of argon or nitrogen and thus cleaned, although the present invention may dispense with doing so. Furthermore before aluminum oxynitride film 31 is deposited the cavity may also have facet 16 heated and simultaneously exposed to a plasma. Furthermore when the facet is exposed to the plasma, for example it may be exposed to a plasma of argon and thereafter followed by that of nitrogen, or vice versa. Other than argon and nitrogen, for example a rare gas for example of helium, neon, xenon, krypton or the like can also be used. Furthermore, while preferably the cavity is provided at facet 16 with aluminum oxynitride film 31 deposited with the facet heated at at least 100° C. and at most 500° C., the present invention may dispense with thus heating the facet in depositing aluminum oxynitride film 31.

After aluminum oxynitride film 31 is deposited to have a thickness of 6 nm, as described above, the gaseous argon is introduced into film deposition furnace 50 at a modified flow rate of 40.0 sccm and the gaseous oxygen introduced thereinto at a modified flow rate of 6.8 sccm, and the gaseous nitrogen introduced thereinto is stopped to deposit aluminum oxide film 32 on aluminum oxynitride film 31 to have a thickness of 76 nm. Herein, the aforementioned RF power and microwave power remain unchanged, i.e. are each 500 W.

Note that aluminum oxynitride film 31 may underlie an oxide film other than aluminum oxide film 32, such as silicon oxide film, titanium oxide film, hafnium oxide film, zirconium oxide film, niobium oxide film, tantalum oxide film, yttrium oxide film or a similar oxide film. Furthermore in the present invention aluminum oxynitride film 31 or a similar oxynitride film may underlie an oxide film deposited by a method other than that of depositing an oxynitride film, e.g. by ECR-sputtering aluminum oxynitride film 31, as described in the present embodiment, and depositing aluminum oxide film 32 by electron beam (EB) vapor deposition or the like.

Figure 5:
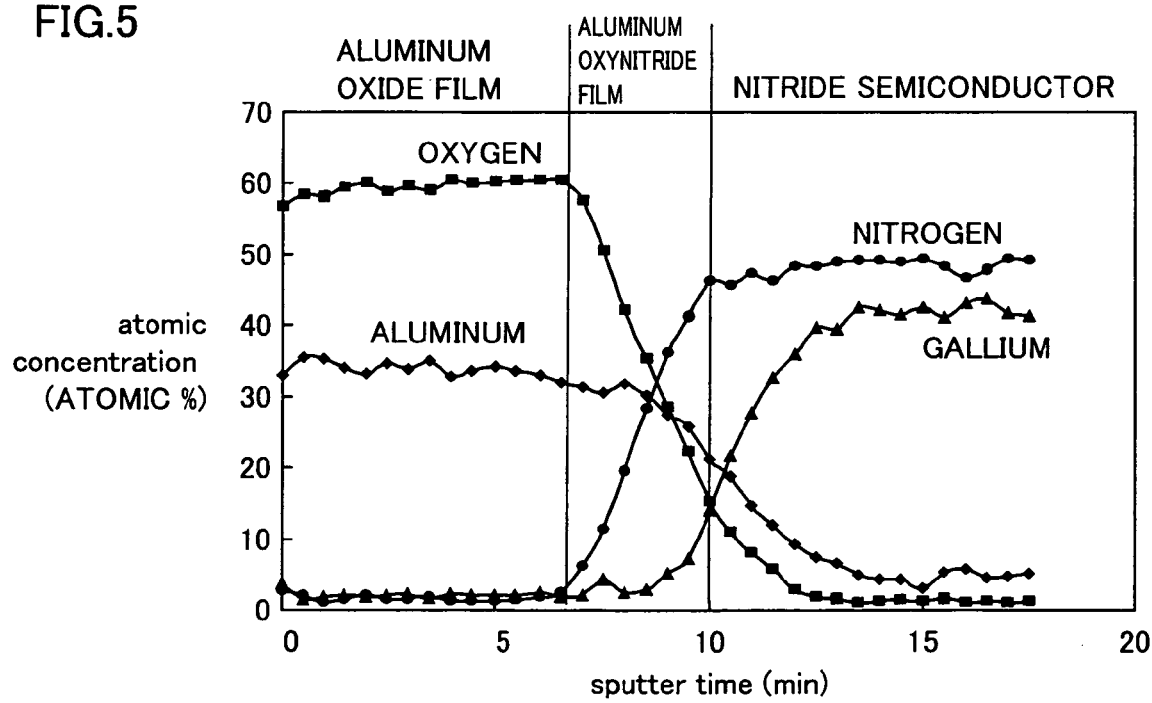
FIG. 5 represents a result of an analysis in composition, as seen depthwise, by AES of a coating film formed of an aluminum oxynitride film deposited on a light emitting facet of a cavity of the present nitride semiconductor laser device of the first embodiment and an aluminum oxide film deposited on the aluminum oxynitride film.

FIG. 5 represents a result of an analysis in composition, as seen depthwise, by AES of a coating film formed of an aluminum oxynitride film deposited on a light emitting facet of a cavity of the nitride semiconductor laser device of the present embodiment and an aluminum oxide film deposited on the aluminum oxynitride film. Herein, as the aluminum oxynitride film is as extremely thin as 6 nm, the content of the oxygen of the aluminum oxynitride film is hidden by the oxygen of the aluminum oxide film and thus cannot be obtained simply by AES. However, it can be obtained by TEM-EDX.

After aluminum oxynitride film 31 and aluminum oxide film 32 are deposited, the aforementioned ECR sputtering or the like is employed to deposit on the light reflecting facet 17 of the cavity aluminum oxynitride film 33, then aluminum oxide film 34, and then highly reflective film 35. Preferably these films are also deposited after the facet is heated and thus cleaned and/or exposed to a plasma and thus cleaned.

It should be noted, however, that having a light emitting facet degraded would be considered as a more serious concern, since the light emitting facet has large optical density, and it is often the case that having a light reflecting facet degraded would not be a concern, since the light reflecting facet has smaller optical density than the light emitting facet. Accordingly the present invention only requires that the cavity have the light emitting facet coated with a coating film formed of oxynitride film and oxide film, and the cavity may have the light reflecting facet without aluminum oxynitride film or the like covering it.

Furthermore while in the present embodiment the cavity has the light reflecting facet 16 provided with aluminum oxynitride film 31 having a thickness of 6 nm, it can without a problem in particular be replaced with aluminum oxynitride film 31 having as large a thickness for example as 50 nm.

Furthermore the cavity having a facet coated with the aforementioned film may subsequently be heated. This can be expected to remove moisture contained in the aforementioned film and improve the film in quality.

Thus the aforementioned sample is provided at the cavity on the light emitting facet 16 with aluminum oxynitride film 31 and then aluminum oxide film 32, and on the light reflecting facet 17 with aluminum oxynitride film 33, then aluminum oxide film 34 and then highly reflected film 35, and is thereafter divided into chips to obtain the nitride semiconductor laser device of the present embodiment.

Figure 6:
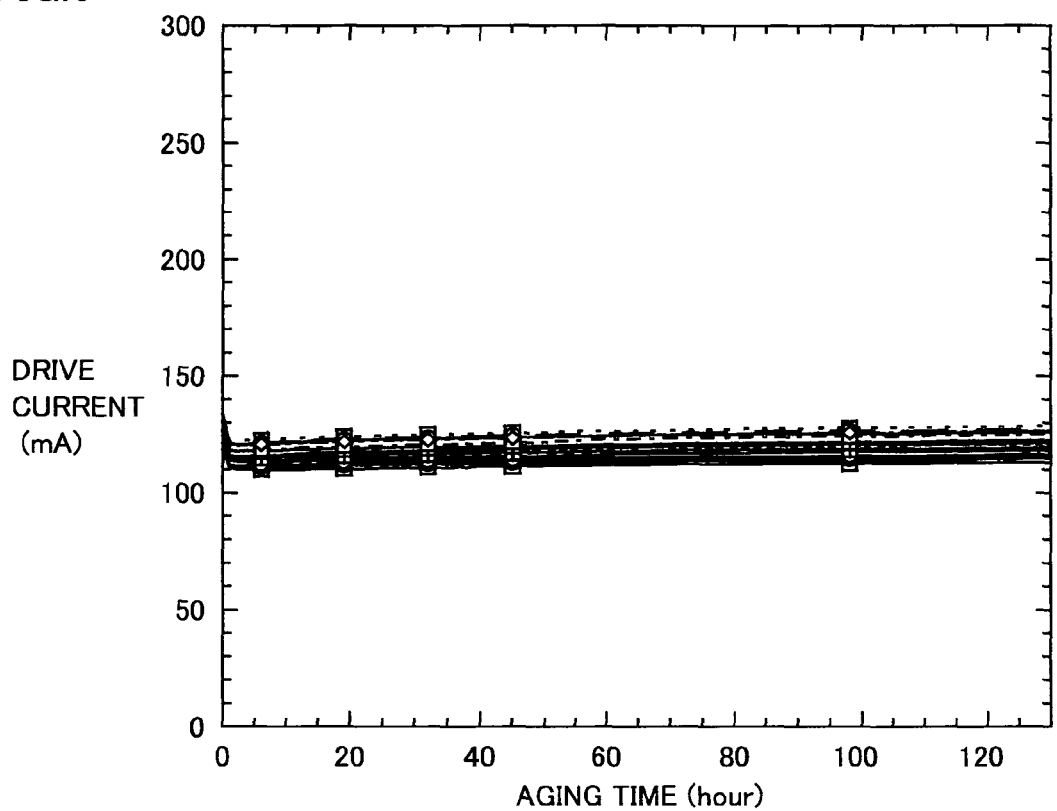
FIG. 6 represents a result of an aging test conducted with the present nitride semiconductor laser device of the first embodiment.
Figure 9:
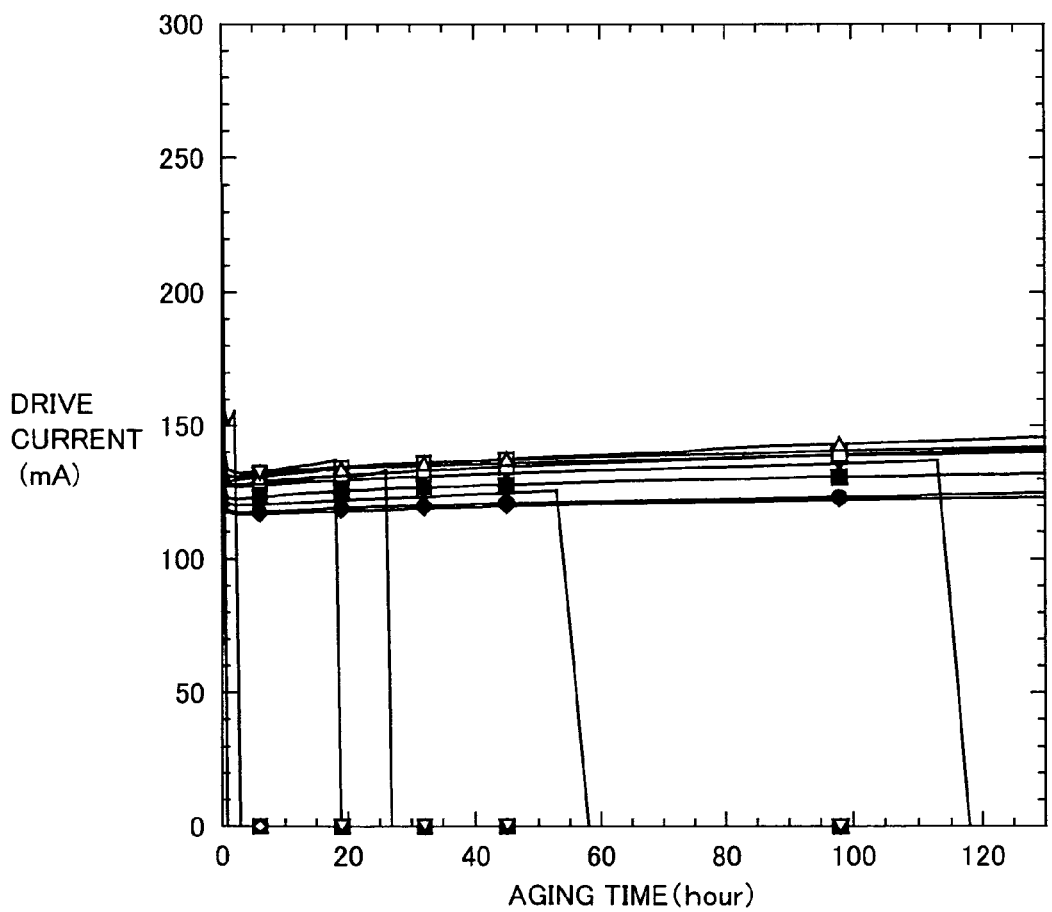
FIG. 9 represents a result of an aging test conducted with a conventional nitride semiconductor laser device.

The nitride semiconductor laser device of the present embodiment thus obtained is continuously lased in an environment at 70° C. to provide an optical output of 100 mW to conduct an aging test. A result thereof is shown in FIG. 6. As shown in the figure, 20 such nitride semiconductor laser devices of the present embodiment having undergone the aging test over 130 hours are all still driven without stopping lasing. When the nitride semiconductor laser device of the present embodiment is compared with a conventional nitride semiconductor laser device having undergone a similar aging test (see FIG. 9), it is obvious that the former is higher in reliability than the latter.

The effect of reducing a nonradiative recombination level that an AlN film is expected to provide is attributed to the absence of oxygen. Accordingly, when employing aluminum oxynitride film containing oxygen is compared with employing the AlN film, one may infer that the former would impair a nitride semiconductor laser device in reliability. In reality, however, the former enhances the nitride semiconductor laser device in reliability, since when the combination of AlN film and aluminum oxide film is compared with that of aluminum oxynitride film and aluminum oxide film, the latter is inferred to provide an interface having a satisfactory condition. More specifically, that the aluminum oxynitride film and the aluminum oxide film both contain oxygen and thus for example contribute to satisfactory contact or the like, is inferred as a cause of enhancing the nitride semiconductor laser device in reliability. Furthermore, among oxynitride films, aluminum oxynitride film is high in thermal conductivity, and such is also inferred as a cause of enhancing the nitride semiconductor laser device in reliability.

Second Embodiment

The present embodiment provides a nitride semiconductor laser-device similar in configuration to that of the first embodiment except that the cavity has the light emitting facet coated with a coating film modified in configuration.

Herein in the present embodiment the nitride semiconductor laser device has a cavity with a light emitting facet provided with a 20 nm thick aluminum oxynitride film and thereon a 69 nm thick aluminum oxide film deposited to provide a reflectance of 5%. Note that the aluminum oxynitride film and the aluminum oxide film are deposited in a method and under a condition similar to those described in the first embodiment, and the aluminum oxynitride film contains aluminum, oxygen and nitrogen in amounts of 35 atomic %, 3 atomic % and 62 atomic %, respectively.

Figure 7:
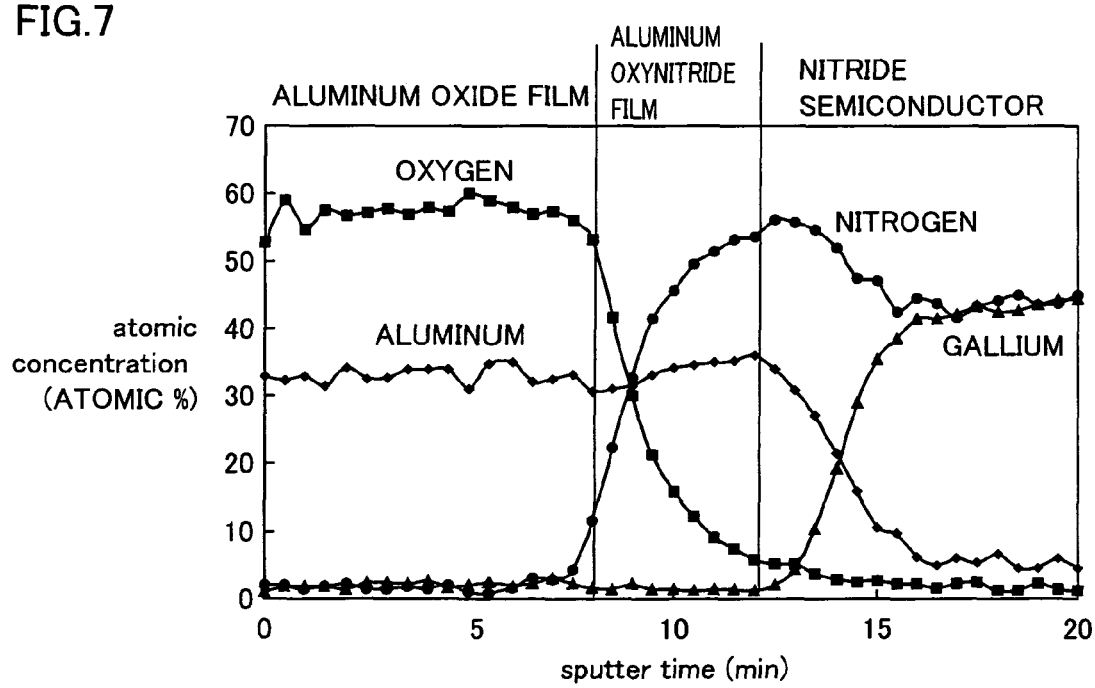
FIG. 7 represents a result of a depthwise AES analysis of a coating film formed of an aluminum oxynitride film deposited on a light emitting facet of a cavity of the present nitride semiconductor laser device of a second embodiment and an aluminum oxide film deposited on the aluminum oxynitride film.

FIG. 7 represents a result of a depthwise AES analysis of a coating film formed of an aluminum oxynitride film deposited on a light emitting facet of a cavity of the nitride semiconductor laser device of the present embodiment and an aluminum oxide film deposited on the aluminum oxynitride film. Also herein the content of the oxygen of the aluminum oxynitride film is hidden by the oxygen of the aluminum oxide film and thus cannot be obtained simply by AES. However, it can be obtained by TEM-EDX.

20 such nitride semiconductor laser devices of the present embodiment underwent an aging test similarly as described in the first embodiment, and it has been confirmed that the 20 nitride semiconductor laser devices having undergone the aging test over 130 hours, similarly as described in the first embodiment, are all driven without stopping lasing. Thus it has at least been confirmed that the present invention effectively operates when the cavity has a light emitting facet coated with a coating film including an aluminum oxynitride film therein having a thickness of at least 6 nm and at most 20 nm.

Note that it is undesirable that the cavity has the light emitting facet coated with a coating film including an aluminum oxynitride film therein having a thickness of 1 nm or smaller, since the aluminum oxynitride film can hardly be controlled in thickness and may partially be not provided. In contrast, if the cavity has the light emitting facet coated with a coating film including an aluminum oxynitride film therein and increased in thickness, then there is a possibility that stress becomes an issue to be considered. However, the present invention's effect would not be impaired because the aluminum nitride film is increased in thickness.

Third Embodiment

The present embodiment provides a nitride semiconductor laser device similar in configuration to that of the first embodiment except that the cavity has the light emitting facet coated with a coating film modified in configuration.

Herein in the present embodiment the nitride semiconductor laser device is fabricated as follows: except that the film deposition furnace receives gaseous nitrogen at a flow rate of 1.5 sccm, conditions similar to those described in the first embodiment are adopted, and a 6 nm thick aluminum oxynitride film is deposited as described in the first embodiment, although its content of oxygen is varied, and subsequently thereon a 76 nm thick aluminum oxide film is deposited, similarly as described in the first embodiment.

Figure 8:
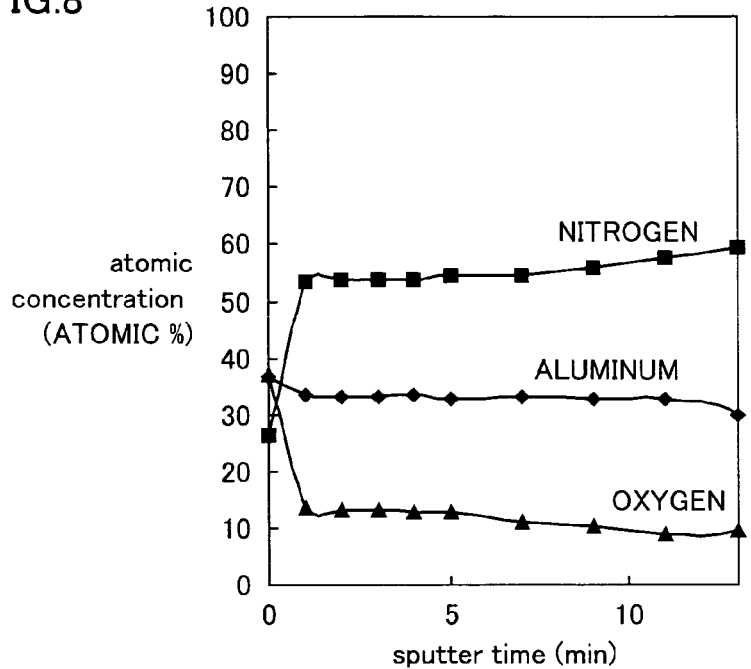
FIG. 8 represents a result of a depthwise AES analysis of an aluminum oxynitride film separately provided under a condition identical to that applied to an aluminum oxynitride film deposited on a light emitting facet of a cavity of the present nitride semiconductor laser device of a third embodiment.

FIG. 8 represents a result of a depthwise AES analysis of an aluminum oxynitride film separately provided under the same conditions as described above. As shown in FIG. 8, the aluminum oxynitride film contains aluminum, oxygen and nitrogen in amounts of 33 atomic %, 11 atomic % and 56 atomic %, respectively, uniformly as seen depthwise.

20 nitride semiconductor laser devices of the present embodiment also underwent an aging test similarly as described in the first embodiment, and it has been confirmed that the 20 nitride semiconductor laser devices having undergone the aging test over 130 hours, similarly as described in the first embodiment, are all driven without stopping lasing. Thus it has been confirmed that the present invention effectively operates when the cavity has a light emitting facet coated with a coating film including an aluminum oxynitride film containing oxygen in an amount of at least 3 atomic % and at most 11 atomic %.

Note that preferably the cavity has the light emitting facet coated with a coating film including an aluminum oxynitride film containing oxygen in an amount of at least 1 atomic %. An oxygen content smaller than 1 atomic % may not provide the effect of containing oxygen. Furthermore, preferably, the cavity has the light emitting facet coated with a coating film including an aluminum oxynitride film containing oxygen in an amount of at most 50 atomic %. An oxygen content larger than 50 atomic % may cause a nonradiative recombination level Fourth Embodiment The present embodiment provides a nitride semiconductor laser device similar in configuration to that of the first embodiment except that the former is adjusted to lase at a wavelength of 460 nm, that it has a ridged stripe having a width of 20 μm, and that it has a cavity with a light emitting facet coated with a coating film modified in configuration and a light reflecting facet provided with a film modified in configuration. Note that the wavelength is adjusted by changing in composition ratio the AlGaInN of an AlGaInN multi quantum well active layer.

Herein in the present embodiment the nitride semiconductor laser device has a cavity with a light emitting facet provided with a 6 nm thick aluminum oxynitride film and thereon a 83 nm thick aluminum oxide film is deposited to provide a reflectance adjusted to be approximately 5%. Furthermore the cavity has a light reflecting facet provided with a 6 nm thick aluminum oxynitride film deposited under the same conditions as the film coating the light emitting facet of the cavity and on the aluminum oxynitride film a 80 nm thick aluminum oxide film is deposited, and furthermore a 81 nm thick silicon oxide film and a 54 nm thick titanium oxide film serving as one pair are deposited by four pairs in layers, with the silicon oxide film first deposited, and thereafter on a frontmost surface a 162 nm thick silicon oxide film is deposited to provide a highly reflective film.

20 nitride semiconductor laser devices of the present embodiment also underwent an aging test similarly as described in the first embodiment, and it has been confirmed that the 20 nitride semiconductor laser devices having undergone the aging test over 30 hours, similarly as described in the first embodiment, are all driven without stopping lasing.

The nitride semiconductor laser device of the present invention that lases at a wavelength of 460 nm can be employed as an excitation source for an illumination device. Furthermore the present invention is suitably applicable to a nitride semiconductor laser device having a ridged stripe portion having a width of at least 2 μm and at most 100 μm and lasing at a wavelength of at least 370 μm and at most 470 μm.

Fifth Embodiment

The present embodiment provides a nitride semiconductor laser device similar in configuration to that of the first embodiment except that it has a cavity with a light emitting facet coated with a coating film modified in configuration and a light reflecting facet provided with a film modified in configuration.

Herein in the present embodiment the nitride semiconductor laser device has a cavity with a light emitting facet provided with a 6 nm thick silicon oxynitride film and a 77 nm thick aluminum oxide film thereon. Furthermore the cavity has a light reflecting facet provided with a 6 nm thick silicon oxynitride film deposited under the same conditions as the coating film coating the light emitting facet of the cavity and on the silicon oxynitride film a 81 nm thick silicon oxide film and a 54 nm thick titanium oxide film serving as one pair are deposited by four pairs in layers, with the silicon oxide film first deposited, and thereafter on a frontmost surface a 162 nm thick silicon oxide film is deposited to provide a highly reflective film.

Note that the silicon oxynitride films deposited on the light emitting and reflecting facets, respectively, of the cavity each contain silicon, oxygen and nitrogen in amounts of 34 atomic %, 3 atomic % and 63 atomic %, respectively.

Nitride semiconductor laser devices of the present embodiment also underwent an aging test similarly as described in the first embodiment, and it has been confirmed that when a period of time of 130 hours elapsed, 95% of the laser device having undergone the test were still driven without stopping lasing.

Sixth Embodiment

The present embodiment provides a nitride semiconductor laser device similar in configuration to that of the first embodiment except that it has a cavity with a light emitting facet coated with a coating film modified in configuration and a light reflecting facet provided with a coating film modified in configuration.

Herein in the present embodiment the nitride semiconductor laser device has a cavity with a light emitting facet provided with a 3 nm thick silicon oxynitride film and a 67 nm thick silicon oxide film thereon. Furthermore the cavity has a light reflecting facet provided with a 6 nm thick silicon oxynitride film deposited under the same conditions as the coating film coating the light emitting facet of the cavity and on the silicon oxynitride film a 81 nm thick silicon oxide film and a 54 nm thick titanium oxide film serving as one pair are deposited by four pairs in layers, with the silicon oxide film first deposited, and thereafter on a frontmost surface a 162 nm thick silicon oxide film is deposited to provide a highly reflective film.

Note that the silicon oxynitride films deposited on the light emitting and reflecting facets, respectively, of the cavity each contain silicon, oxygen and nitrogen in amounts of 34 atomic %, 3 atomic % and 63 atomic %, respectively.

Nitride semiconductor laser devices of the present embodiment also underwent an aging test similarly as described in the first embodiment, and it has been confirmed that when a period of time of 130 hours elapsed, 93% of the laser device having undergone the test were still driven without stopping lasing.

The present invention is applicable for example to a nitride semiconductor laser device lasing at a wavelength of the ultraviolet range to the green range, a nitride semiconductor laser device of a broad area type having a stripe of several tens μm in width, a nitride semiconductor light emitting diode device lasing at a wavelength of the ultraviolet range to the red range, or the like.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A nitride semiconductor light emitting device comprising:
   a light emitting portion coated with a coating film, wherein
   said light emitting portion is formed of a nitride semiconductor, and
   said coating film is formed of a stack of an oxynitride film and an oxide film, and
   said oxynitride film is an aluminum oxynitride film, and said oxynitride film is in contact with said light emitting portion, and
   said oxide film is in contact with said oxynitride film, said oxynitride film being disposed between said oxide film and said light emitting portion, and
   a substrate of the nitride semiconductor light emitting device is a GaN substrate, and
   the nitride semiconductor light emitting device is a nitride semiconductor laser device and said light emitting portion is a facet of a cavity, the facet being a resonator face and a primary light emitting surface of the nitride semiconductor laser device.

2. The nitride semiconductor light emitting device according to claim 1, wherein said oxide film is one of aluminum oxide film, silicon oxide film, titanium oxide film, hafnium oxide film, zirconium oxide film, niobium oxide film, tantalum oxide film, and yttrium oxide film.

3. The nitride semiconductor light emitting device according to claim 1, wherein the facet is a cleaved surface of the nitride semiconductor light emitting device.

4. A method of fabricating the nitride semiconductor light emitting device according to claim 1, comprising the steps of:
   providing a cleavage so as to form said facet of said cavity; and
   coating said facet of said cavity with the coating film formed of the oxynitride film deposited adjacent to said facet of said cavity and the oxide film deposited on said oxynitride film.

5. The method of fabricating the nitride semiconductor light emitting device according to claim 4, wherein said oxynitride film is fabricated by using aluminum oxide as a target.

6. A nitride semiconductor light emitting device comprising:
   a light emitting portion coated with a coating film, wherein
   said light emitting portion is formed of a nitride semiconductor, and
   said coating film is formed of a stack of an oxynitride film and an oxide film, and said oxynitride film is in contact with said light emitting portion, and
   said oxynitride film is an aluminum oxynitride film, and
   said oxide film is in contact with said oxynitride film, said oxynitride film being disposed between said oxide film and said light emitting portion,
   wherein said oxide film is not silicon oxide film, and
   a substrate of the nitride semiconductor light emitting device is a GaN substrate, and
   the nitride semiconductor light emitting device is a nitride semiconductor laser device and said light emitting portion is a facet of a cavity, the facet being a resonator face and a primary light emitting surface of the nitride semiconductor laser device.

7. A nitride semiconductor light emitting device comprising:
   a light emitting portion coated with a coating film, the light emitting portion being an endface perpendicular to a lengthwise direction of a ridged stripe portion of the nitride semiconductor light emitting device, wherein
   said light emitting portion is formed of a nitride semiconductor, and
   said coating film is formed of a stack of an oxynitride film and an oxide film, and
   said oxynitride film is an aluminum oxynitride film, and said oxynitride film is in contact with said light emitting portion, and
   said oxide film is in contact with said oxynitride film, said oxynitride film being disposed between said oxide film and said light emitting portion, and
   a substrate of the nitride semiconductor light emitting device is a GaN substrate, and
   the nitride semiconductor light emitting device is a nitride semiconductor laser device and said light emitting portion is a facet of a cavity, the facet being a resonator face and a primary light emitting surface of the nitride semiconductor laser device.

8. A nitride semiconductor light emitting device comprising:
   a light emitting portion coated with a coating film, the light emitting portion being an endface perpendicular to a lengthwise direction of a ridged stripe portion of the nitride semiconductor light emitting device, wherein said light emitting portion is formed of a nitride semiconductor, and said coating film is formed of a stack of an oxynitride film and an oxide film, and said oxynitride film is in contact with said light emitting portion, and said oxynitride film is an aluminum oxynitride film, and said oxide film is in contact with said oxynitride film, said oxynitride film being disposed between said oxide film and said light emitting portion, wherein said oxide film is not silicon oxide film, and a substrate of the nitride semiconductor light emitting device is a GaN substrate, and the nitride semiconductor light emitting device is a nitride semiconductor laser device and said light emitting portion is a facet of a cavity, the facet being a resonator face and a primary light emitting surface of the nitride semiconductor laser device.

* * * * *